United States Patent
Takizawa

(10) Patent No.: US 9,582,414 B2
(45) Date of Patent: *Feb. 28, 2017

(54) SEMICONDUCTOR STORAGE DEVICE AND CONTROL METHOD THEREOF

(71) Applicant: KABUSHIKI KAISHA TOSHIBA, Minato-ku, Tokyo (JP)

(72) Inventor: Ryousuke Takizawa, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/988,558

(22) Filed: Jan. 5, 2016

(65) Prior Publication Data

US 2016/0154732 A1 Jun. 2, 2016

Related U.S. Application Data

(63) Continuation of application No. 14/006,296, filed as application No. PCT/JP2012/054985 on Feb. 28, 2012, now Pat. No. 9,256,523.

(30) Foreign Application Priority Data

Mar. 23, 2011 (JP) .................................. 2011-064536

(51) Int. Cl.
G06F 12/02 (2006.01)
G11C 7/10 (2006.01)
(Continued)

(52) U.S. Cl.
CPC ........ *G06F 12/0238* (2013.01); *G06F 3/0604* (2013.01); *G06F 3/0644* (2013.01);
(Continued)

(58) Field of Classification Search
CPC .... G06F 12/0238; G06F 12/00; G06F 3/0604; G06F 3/0644
See application file for complete search history.

(56) References Cited

U.S. PATENT DOCUMENTS 6,314,049 B1 11/2001 Roohparvar
6,625,081 B2 9/2003 Roohparvar et al.
(Continued)

FOREIGN PATENT DOCUMENTS

CN 1510692 A 7/2004
CN 101930794 A 12/2010
(Continued)

OTHER PUBLICATIONS

International Search Report dated Feb. 2, 2012 received in corresponding application No. PCT/JP2012/054985—3 pages.
(Continued)

*Primary Examiner* — Ryan Bertram
(74) *Attorney, Agent, or Firm* — Knobbe, Martens, Olson & Bear, LLP

(57) ABSTRACT

A memory includes a cell array including memory cells storing data, and a write driver writing data to the cells. A write driver performs or does not perform writing of write data according to write mask data input along with the write data. A multiplexer selectively outputs a write protect signal or the write mask data. The write protect signal is fixed to a command prohibiting the write data from being written. The command is included in the write mask data. A write protect controller controls the multiplexer to output the write protect signal when an address of a write protect area in the cell array matches an address of the write data. The write protect controller controls the multiplexer to output the write mask data as it is when the address of the write protect area in the cell array does not match the address of the write data.

6 Claims, 6 Drawing Sheets

(51) Int. Cl.
*G11C 8/08* (2006.01)
*G06F 12/00* (2006.01)
*G11C 7/24* (2006.01)
*G11C 8/20* (2006.01)
*G11C 11/16* (2006.01)
*G06F 3/06* (2006.01)
*G06F 12/14* (2006.01)

(52) U.S. Cl.
CPC ............ *G06F 3/0688* (2013.01); *G06F 12/00* (2013.01); *G06F 12/1425* (2013.01); *G11C 7/1009* (2013.01); *G11C 7/24* (2013.01); *G11C 8/08* (2013.01); *G11C 8/20* (2013.01); *G11C 11/1695* (2013.01); *G06F 12/1416* (2013.01); *G06F 12/1441* (2013.01); *G06F 2212/1016* (2013.01); *G06F 2212/202* (2013.01)

(56) References Cited

U.S. PATENT DOCUMENTS

| | | | |
|---|---|---|---|
| 6,654,307 | B2 | 11/2003 | Widmer et al. |
| 6,654,847 | B1 | 11/2003 | Roohparvar et al. |
| 6,667,932 | B2 | 12/2003 | Roohparvar et al. |
| 6,728,798 | B1 | 4/2004 | Roohparvar |
| 6,798,710 | B2 | 9/2004 | Roohparvar et al. |
| 6,826,097 | B2 | 11/2004 | Kang |
| 6,845,057 | B2 | 1/2005 | Widmer et al. |
| 6,904,498 | B2 * | 6/2005 | Stolowitz ............ G06F 11/1076 711/114 |
| 6,944,092 | B2 | 9/2005 | Kang |
| 7,016,254 | B2 | 3/2006 | Roohparvar et al. |
| 7,096,283 | B2 | 8/2006 | Roohparvar |
| 7,603,534 | B2 | 10/2009 | Roohparvar |
| 8,010,767 | B2 | 8/2011 | Roohparvar |
| 8,437,188 | B2 | 5/2013 | Kajigaya |
| 2003/0031052 | A1 | 2/2003 | Roohparvar et al. |
| 2003/0031076 | A1 | 2/2003 | Widmer et al. |
| 2003/0123288 | A1 | 7/2003 | Roohparvar et al. |
| 2003/0128619 | A1 | 7/2003 | Roohparvar et al. |
| 2004/0057284 | A1 | 3/2004 | Widmer et al. |
| 2004/0120187 | A1 | 6/2004 | Kang |
| 2004/0196725 | A1 | 10/2004 | Kang |
| 2004/0199713 | A1 | 10/2004 | Roohparvar |
| 2005/0018522 | A1 | 1/2005 | Roohparvar et al. |
| 2005/0157553 | A1 * | 7/2005 | Perroni .................. G11C 16/08 365/185.11 |
| 2005/0289313 | A1 | 12/2005 | Roohparvar |
| 2008/0205146 | A1 * | 8/2008 | Kajigaya ................ G11C 14/00 365/185.08 |
| 2010/0088484 | A1 | 4/2010 | Roohparvar |
| 2013/0229870 | A1 | 9/2013 | Kajigaya |
| 2014/0075113 | A1 | 3/2014 | Takizawa |

FOREIGN PATENT DOCUMENTS

| | | |
|---|---|---|
| JP | 2004-505404 A | 2/2004 |
| JP | 2004-206856 A | 7/2004 |
| JP | 2004-311002 A | 11/2004 |
| JP | 2005-500643 | 1/2005 |
| JP | 2006-164511 | 6/2006 |
| JP | 3843099 | 11/2006 |
| JP | 2008-204581 A | 4/2008 |
| JP | 2009-043110 | 2/2009 |

OTHER PUBLICATIONS

JEDEC Standard, "DDR2 SDRAM Specification" JESD79-2F, Nov. 2009, p. 40-41.
International Search Report dated Jun. 12, 2012 received in corresponding application No. PCT/JP2012/054985—3 pages.
International Preliminary Report on Patentability dated Oct. 3, 2013 received in corresponding application No. PCT/JP2012/054985—6 pages.
Office Action dated May 6, 2015 in corresponding Chinese Application: 201280011665.1, 9 pgs.

* cited by examiner

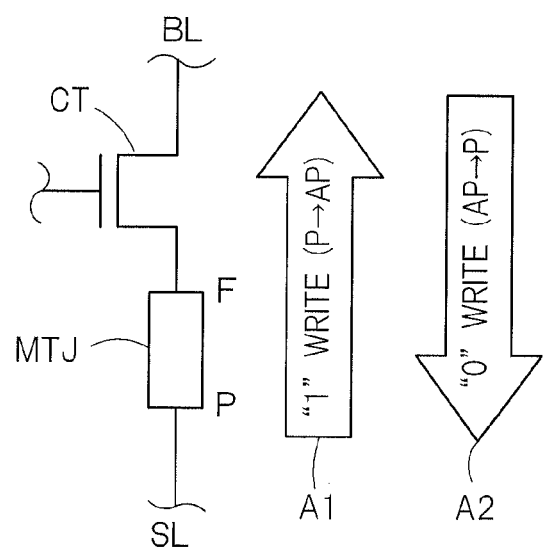
F I G. 2

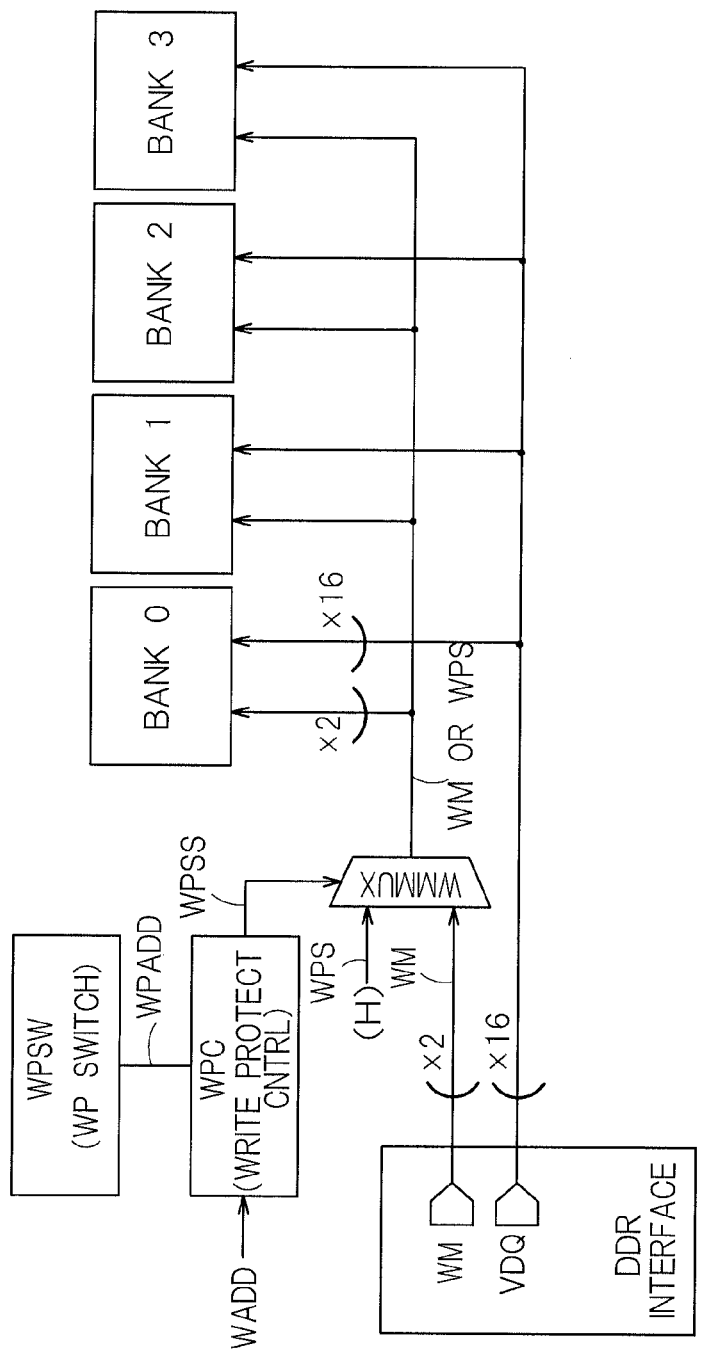
F I G. 4

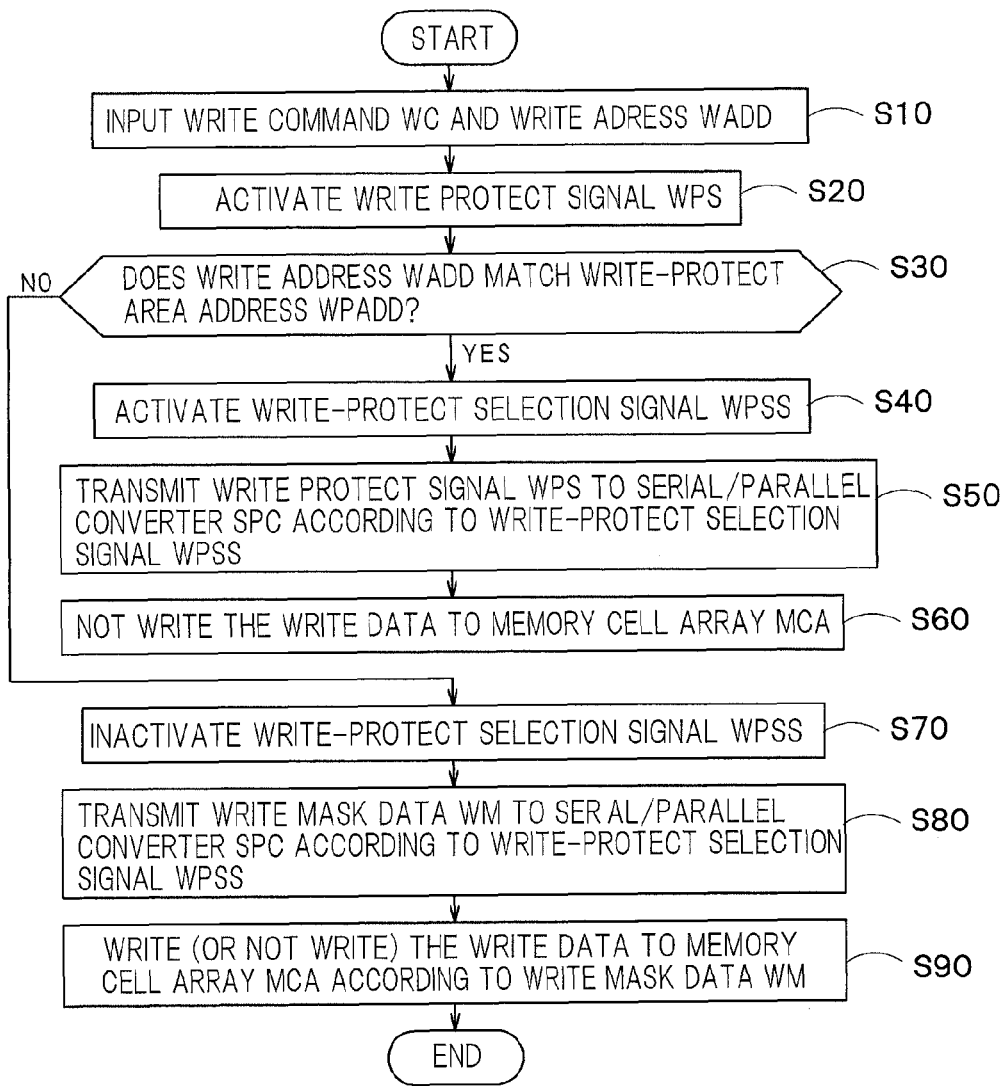
F I G. 5

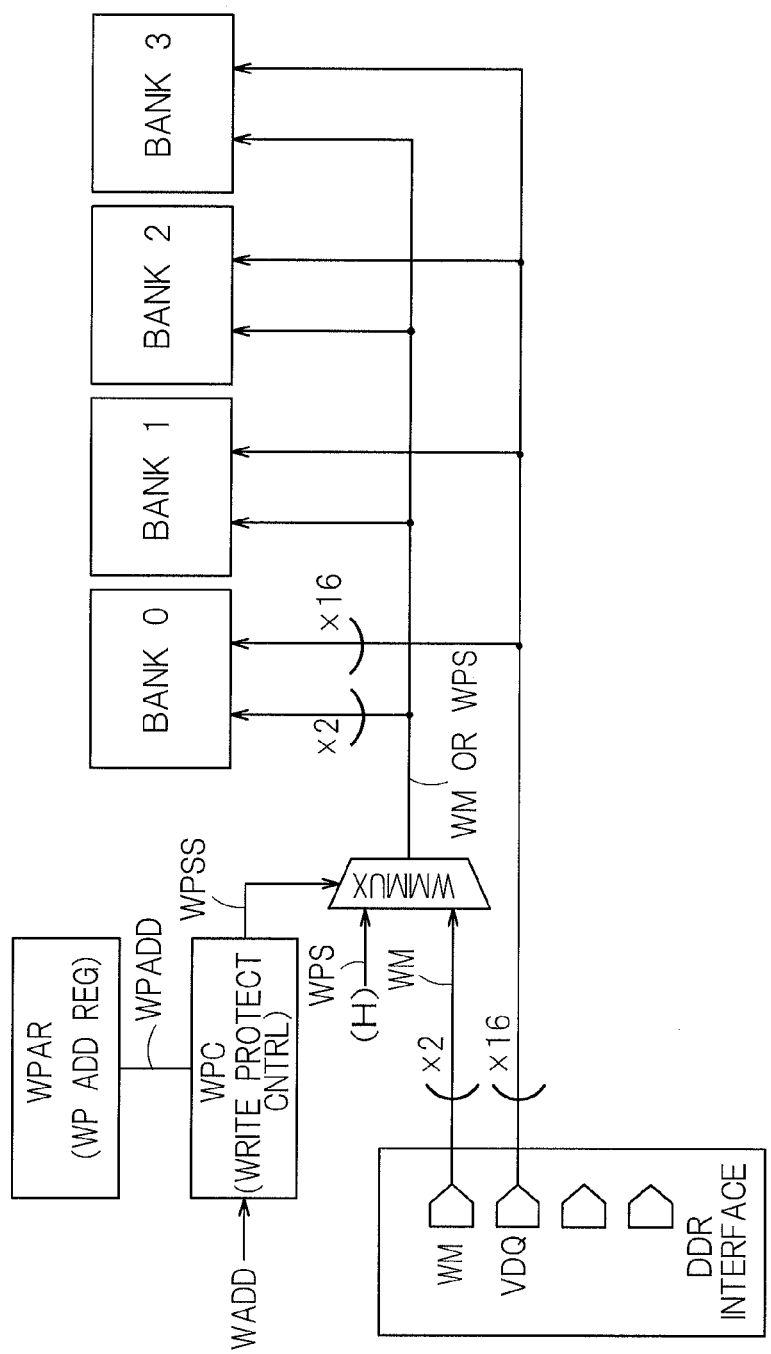
F I G. 6

SEMICONDUCTOR STORAGE DEVICE AND CONTROL METHOD THEREOF

CROSS REFERENCE TO RELATED APPLICATIONS

This application is a continuation of U.S. application Ser. No. 14/006,296, filed on Nov. 21, 2013 and titled "SEMICONDUCTOR STORAGE DEVICE AND CONTROL METHOD THEREOF," which is based upon and claims the benefit of priority from the prior Japanese Patent Application No. 2011-064536, filed on Mar. 23, 2011, the entire contents of which are incorporated herein by reference.

FIELD

The embodiments of the present invention relate to a semiconductor storage device and control method thereof.

BACKGROUND

A nonvolatile ROM (Read Only Memory) has been conventionally used as a write-once memory or a memory having an extremely low rewrite frequency such as a firmware memory. Furthermore, differently from a volatile RAM (Random Access Memory), the nonvolatile ROM can be regarded as a memory capable of robustly protecting internal programs and data from user's inadvertent rewriting or rewriting due to operation system and application system operations.

On the other hand, the development of a nonvolatile RAM (MRAM (Magnetic Random Access Memory)) using resistive change elements, a PCRAM (Phase Change Random Access Memory), a ReRAM (Resistive Random Access Memory), and the like has been underway in recent years. For example, when these nonvolatile RAMs include DDR (Double Data Rate) interfaces and enable high-speed writing, these can be used not only as memories having low rewrite frequencies such as a firmware memory but also as a nonvolatile large-capacity working memory. Therefore, attention is paid to these nonvolatile RAMs as memories each of which can replace both the existing nonvolatile ROM and existing volatile RAM.

However, the nonvolatile RAMs described above have the following problems. That is, when one of the nonvolatile RAMs is used to replace both the existing nonvolatile ROM and existing volatile RAM, there is still a risk that the programs and data within the nonvolatile RAM are rewritten by user's inadvertence or by operation system and application system operations. Therefore, for nonvolatile RAMs, there is still a need to robustly protect programs and data that are necessary to be protected from undesired rewriting.

BRIEF DESCRIPTION OF THE DRAWINGS

FIG. 2 is an explanatory diagram showing a configuration of one memory cell MC;

FIG. 4 is a block diagram of an MRAM in which a storage unit that stores therein the write-protect area address WPADD is constituted by the write protect switch WPSW;

FIG. 5 is a flowchart showing operations performed by the MRAM according to the first embodiment; and FIG. 6 is a block diagram showing a configuration of an MRAM according to a second embodiment.

DETAILED DESCRIPTION

Embodiments will now be explained with reference to the accompanying drawings. The present invention is not limited to the embodiments.

A semiconductor storage device according to the present embodiment includes a memory cell array including a plurality of memory cells storing data, and a write driver writing data to the memory cells. A write driver performs or does not perform writing of write data according to write mask data input along with the write data. A multiplexer selectively outputs either a write protect signal or the write mask data. The write protect signal is fixed to a command prohibiting the write data from being written. The command is included in the write mask data. A write protect controller controls the multiplexer to output the write protect signal when an address of a write protect area in the memory cell array matches an address of the write data. The write protect controller controls the multiplexer to output the write mask data as it is when the address of the write protect area in the memory cell array does not match the address of the write data.

First Embodiment

Figure 1:
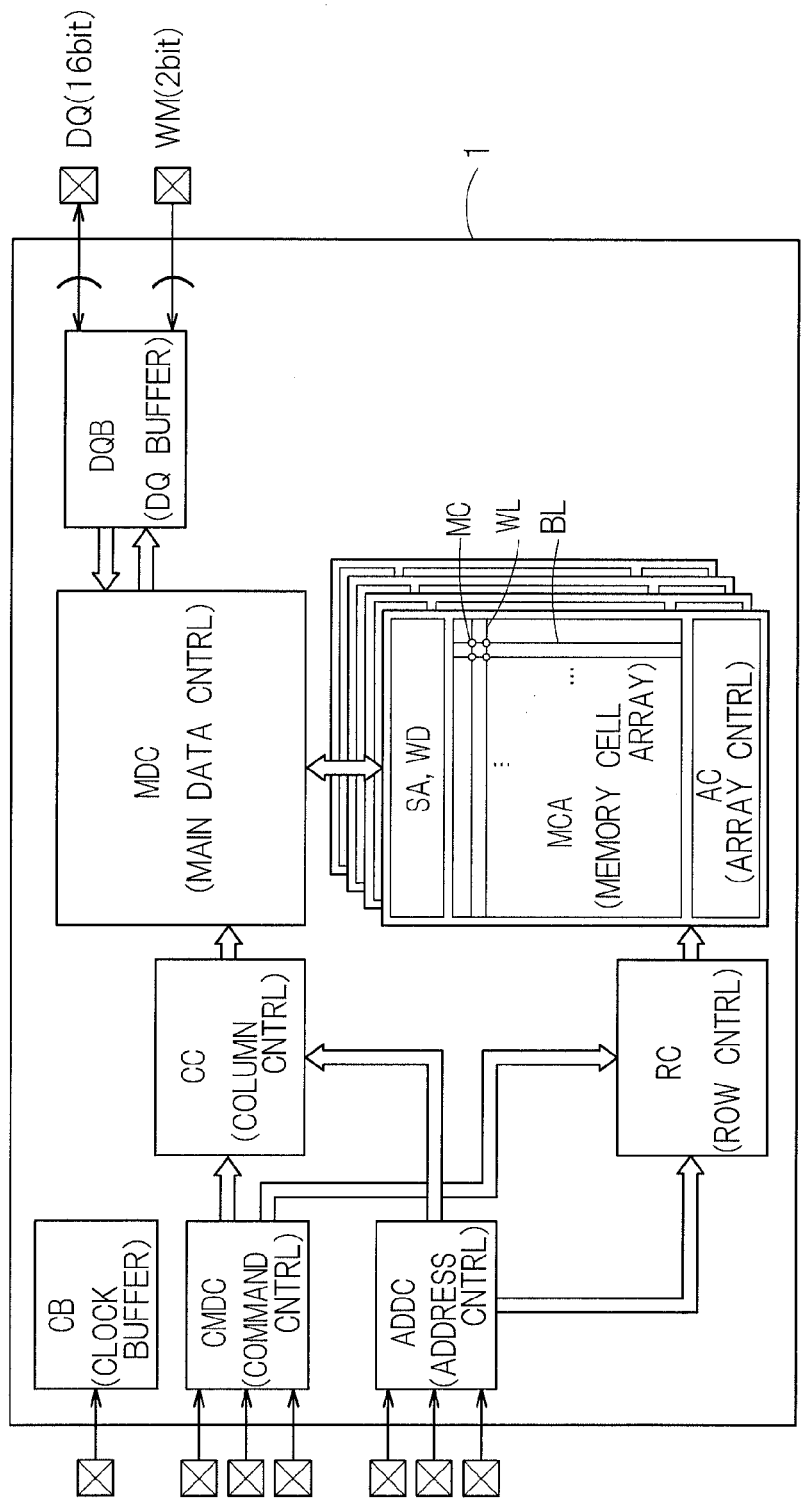
FIG. 1 is a block diagram showing a memory chip of a magnetic random access memory according to a first embodiment.

FIG. 1 is a block diagram showing a memory chip of a magnetic random access memory (hereinafter, "MRAM") according to a first embodiment. The first embodiment is also applicable to a memory (such as a PCRAM or a ReRAM) using resistive change elements other than the MRAM.

The MRAM according to the first embodiment includes memory cell arrays MCA, sense amplifiers SA, write drivers WD, a main data controller MDC, a DQ buffer DQB, a column controller CC, a row controller RC, a clock buffer CB, a command controller CMDC, an address controller ADDC, and array controllers AC.

The memory cell array MCA includes a plurality of memory cells MC arranged two-dimensionally in a matrix. The memory cells MC are arranged to correspond to intersections between bit lines BL (or paired bit lines BL) and word lines WL, respectively. The bit lines BL extend in a column direction. The word lines WL extend in a row direction orthogonal to the column direction.

The sense amplifier SA is connected to the memory cells MC via the bit lines BL and configured to detect data stored in the memory cells MC. The write driver WD is connected to the memory cells MC via the bit lines BL and configured to write data to the memory cells MC.

The main data controller MDC transfers data received from the DQ buffer DQB to the write driver WD under control of the column controller CC or transfers data read from a desired column to the DQ buffer DQB under control of the column controller CC. The main data controller MDC is also configured to prohibit writing of data according to write mask data WM or a write-protect area address WPADD as described later.

The DQ buffer DQB temporarily holds read data via a DQ pad DQ and outputs the read data to outside of a memory chip 1. Alternatively, the DQ buffer DQB receives write data via the DQ pad DQ from outside of the memory chip 1 and temporarily holds the write data.

The MRAM including a DDR interface according to the first embodiment receives the write mask data WM as well as the write data at the time of writing. The write mask data WM is a command for indicating whether to actually write the write data per predetermined bits. For example, 2-bit write mask data WM is added for every 16-bit data. One bit out of the write mask data WM is a bit indicating whether 8-bit data (byte data) as a first half of the 16-bit data is necessary to write. The other one bit out of the write mask data WM is a bit indicating whether 8-bit data as a second half of the 16-bit data is necessary to write. It is thereby possible to issue a command as to whether each byte data is necessary to write using the write mask data WM. In this way, the write mask data WM is normally set per byte data and cannot be used for setting a ROM area.

The column controller CC controls the sense amplifier SA or the write driver WD to operate so as to selectively drive one bit line BL in a desired column according to a column address.

The row controller RC controls a word line driver (not shown) to operate so as to selectively drive a desired word line WL according to a row address.

Clock signals for determining an operation timing of the entire memory chip 1 are input to the clock buffer CB.

The command controller CMDC receives commands indicating various operations such as a read operation and a write operation and controls the column controller CC and the row controller RC according to those commands.

The address controller ADDC receives the row address, the column address, and the like, decodes these addresses, and transmits these addresses to the column controller CC and the row controller RC.

The array controller AC executes an overall control over the memory cell array MCA.

FIG. 2 is an explanatory diagram showing a configuration of one memory cell MC. Each memory cell MC includes a magnetic tunnel junction (MTJ) element MTJ and a cell transistor CT. The MTJ element MTJ and the cell transistor CT are connected in series between one bit line BL and one source line SL. In the memory cell MC, the cell transistor CT is arranged near the bit line BL and the MTJ element MTJ is arranged near the source line SL. The gate of the cell transistor CT is connected to one word line WL.

The MTJ element MTJ using the TMR (tunneling magnetoresistive) effect has a stacked structure constituted by two ferromagnetic layers and a nonmagnetic layer (an insulating thin film) sandwiched between the ferromagnetic layers. The MTJ element MTJ stores therein digital data by a change in a magnetic resistance due to spin-polarized tunneling. The MTJ element MTJ can be set in both a low resistance state and a high resistance state depending on magnetization orientations of the two ferromagnetic layers. For example, when it is defined that the low resistance state indicates data "0" and that the high resistance state indicates data "1", 1-bit data can be recorded in the MTJ element MTJ. Needless to mention, it can be defined that the low resistance state indicates the data "1" and that the high resistance state indicates the data "0". For example, the MTJ element MTJ is configured to sequentially stack a pinned layer P, a tunnel barrier layer, and a recording layer (free layer) F. The pinned layer P and the recording layer F are made of a ferromagnetic body whereas the tunnel barrier layer is made of an insulating film. The pinned layer P is a layer having a fixed magnetization direction, the recording layer F is a layer having a variable magnetization direction, and data is recorded in the MTJ element MTJ depending on the magnetization direction of the recording layer F.

At the time of writing, when a current equal to or higher than an inversion threshold current is carried in the direction of an arrow A1, then the magnetization direction of the recording layer F is anti-parallel to that of the pinned layer P, and the MTJ element MTJ turns into the high resistance state (data "1"). At the time of writing, when the current equal to or higher than the inversion threshold current is carried in the direction of an arrow A2, the magnetization direction of the recording layer F is parallel to that of the pinned layer P, and the MTJ element MTJ turns into the low resistance state (data "0").

In this way, different data can be written to the MTJ element MTJ depending on the direction of the current.

Figure 3:
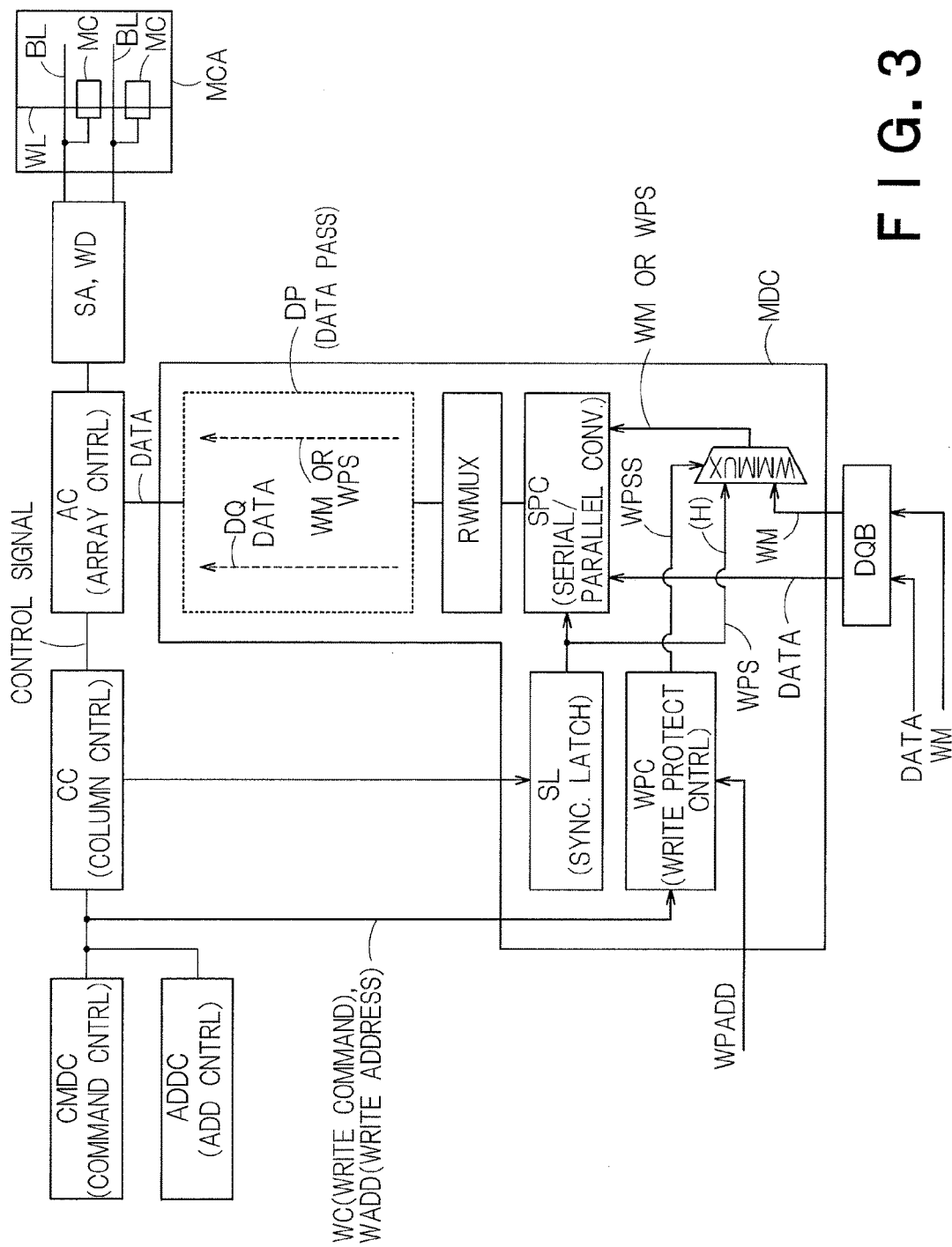
FIG. 3 is a block diagram showing configurations of the main data controller MDC and peripheral circuits thereof.

FIG. 3 is a block diagram showing configurations of the main data controller MDC and peripheral circuits thereof. Because the first embodiment relates to writing, only the configurations related to a write operation are explained and explanations of those related to a read operation will be omitted here.

The main data controller MDC includes a write mask multiplexer WMMUX, a write protect controller WPC, a latch circuit SL, a serial/parallel converter SPC, a read-write multiplexer RWMUX, and a data pass DP.

The main data controller MDC is configured to prohibit data writing or approve the data writing according to the write mask data WM or the write-protect area address WPADD at the time of writing data to the memory cell array MCA.

When receiving the write-protect area address WPADD, an address ADD, and a write command WC, the write protect controller WPC compares the write-protect area address WPADD with the address ADD. The write-protect area address WPADD is an address indicating a write protect area where data cannot be written in one memory cell array MCA or in a plurality of memory cell arrays MCA. For example, the write-protect area address WPADD is the address of an area of storing therein software such as firmware that is normally prohibited from being rewritten (that is, normally prohibited from being accessed).

The write-protect area address WPADD is set or stored in a write protect switch WPSW (FIG. 4) or a write-protect area address register WPAR (FIG. 6) in advance. A write address WADD is a column address and a row address for identifying a selected memory cell array MCA, a selected memory cell MC, a selected page, a selected memory bank or a selected memory block that is a data write target.

As a result of the comparison of the write-protect area address WPADD with the address ADD, when the write-protect area address WPADD matches the address ADD, there is a probability that the write protect area is to be accessed by user's inadvertence or the like. Therefore, the write protect controller WPC activates a write-protect selection signal WPSS to be transmitted to the write mask multiplexer WMMUX.

On the other hand, when the write-protect area address WPADD does not match the address ADD, the write protect controller WPC inactivates the write-protect selection signal WPSS to be transmitted to the write mask multiplexer WMMUX. The write-protect selection signal WPSS is a signal for allowing the write mask multiplexer WMMUX to exclusively (selectively) output either the write mask data WM or a write protect signal WPS. For example, when the write-protect selection signal WPSS is activated, the write mask multiplexer WMMUX selectively outputs the write protect signal WPS. When the write-protect selection signal WPSS is inactivated, the write mask multiplexer WMMUX selectively outputs write mask data WMC as it is.

The latch circuit SL latches a control signal from the column controller CC. Furthermore, when receiving a write command WC, the latch circuit SL activates the write protect signal WPS to be transmitted to the write mask multiplexer WMMUX. The write protect signal WPS is a signal that is identical to the write mask data WM in an active state and that prohibits the write data from the DQ buffer DQB from being written to the memory cell array MCA. During writing, the latch circuit SL always keeps the write protect signal WPS activated. That is, the write protect signal WPS functions as a fixed signal fixed to first write mask data (logical high, for example) included in the write mask data WM and prohibiting data writing.

The write mask multiplexer WMMUX receives the write mask data WM and the write protect signal WPS, and exclusively outputs either the write mask data WM or the write protect signal WPS to the serial/parallel converter SPC according to the write-protect selection signal WPSS.

The serial/parallel converter SPC is configured to convert the write data in a serial form ("serial write data") input from the DQ buffer DQB into parallel data ("parallel write data") synchronously with the control signal latched by the latch circuit SL.

The read-write multiplexer RWMUX transmits the parallel write data obtained by conversion of the serial write data to the array controller AC or transmits read data in a parallel form to the serial/parallel converter SPC.

The write data and the write mask data WM (or the write protect signal WPS) are transmitted to the array controller AC via the data pass DP.

When the array controller AC receives the write mask data WM, the write driver WD operates according to the write mask data WM. That is, the write driver WD performs or does not perform the data writing according to a logical state of the write mask data WM. For example, when the write mask data WM corresponding to the write data (8-bit data, for example) is inactivated to logical low, the write driver WD writes the write data to the memory cell array MCA. When the write mask data WM corresponding to the other write data (8-bit data, for example) is activated to logical high, the write driver WD does not write the write data to the memory cell array MCA.

When the array controller AC receives the write protect signal WPS instead of the write mask data WM, the write driver WD operates according to the write protect signal WPS. That is, the write driver WD prohibits the data writing according to a logical state (always logical high, for example) of the write protect signal WPS. Because the write protect signal WPS is activated to always logical high during the write operation, the write driver WD does not perform the data writing as long as receiving the write protect signal WPS.

In this way, the MRAM according to the first embodiment transmits the write protect signal WPS in place of the write mask data WM to the array controller AC when the memory area designated by the preset write-protect area address WPADD is to be accessed. In other words, the MRAM according to the first embodiment fixes the write mask data WM to an active state when the memory area designated by the preset write-protect area address WPADD is to be accessed. This can forcibly prohibit the data from being written to the memory area designated by the write-protect area address WPADD. That is, the first embodiment can set the memory area designated by the write-protect area address WPADD as an ROM area.

FIG. 4 is a block diagram of an MRAM in which a storage unit that stores therein the write-protect area address WPADD is constituted by the write protect switch WPSW. It suffices that the write protect switch WPSW is a physical switch (such as a DIP switch or a fuse) provided on a memory device or a soft switch incorporated into software. In the first embodiment, a DDR interface is employed as an input/output interface.

The write protect switch WPSW stores therein an address of each write-protect memory bank BANK. With this configuration, when the memory bank BANK is to be accessed, the write protect controller WPC activates the write-protect selection signal WPSS so as not to write the data to the memory bank BANK.

For example, it is assumed that the write protect switch WPSW stores therein an address of a memory bank BANK1 as the write-protect memory bank. When receiving the address of the memory bank BANK1 as the write address WADD, the write protect controller WPC compares the write address (BANK1) with the write-protect area address (BANK1). In this case, the write address (BANK1) matches the write-protect area address (BANK1). Accordingly, the write protect controller WPC activates the write-protect selection signal WPSS.

The write mask multiplexer WMMUX outputs the write protect signal WPS (logical high) to the memory bank BANK1 according to the activated write-protect selection signal WPSS. At this time, the write data is transmitted to the memory bank BANK1; however, the data is not actually written to the memory bank BANK1 because the write protect signal WPS is activated.

On the other hand, when receiving an address of a memory bank BANK0 as the write address WADD, the write protect controller WPC compares the write address (BANK0) with the write-protect area address (BANK1). In this case, the write address (BANK0) does not match the write-protect area address (BANK1). Accordingly, the write protect controller WPC inactivates the write-protect selection signal WPSS.

Because the write-protect selection signal WPSS is inactivated, the write mask multiplexer WMMUX outputs the write mask data WM to the memory bank BANK0 as it is. At this time, the write data is written to the memory bank BANK0 according to the write mask data WM. Therefore, when the write mask data WM is activated (logical high), the write data (8-bit data, for example) corresponding to the write mask data WM is not written to the memory bank BANK0. However, when the write mask data WM is inactivated (logical low), the write data is written to the memory bank BANK0. In this way, the write-protect area address WPADD can be set for every memory bank.

FIG. 5 is a flowchart showing operations performed by the MRAM according to the first embodiment. First, the write command WC and the write address WADD are input to the MRAM (S10). The write command WC and the write address WADD are transmitted to the latch circuit SL and the write protect controller WPC as well as the column controller CC.

The latch circuit SL activates the write protect signal WPS to logical high when receiving the write command WC (S20).

The write protect controller WPC compares the write address WADD with the write-protect area address WPADD (S30). When the write address WADD matches the write-protect area address WPADD (YES at S30), the write protect controller WPC activates the write-protect selection signal WPSS (S40).

The write mask multiplexer WMMUX transmits the write protect signal WPS to the serial/parallel converter SPC according to the write-protect selection signal WPSS (S50).

The write driver WD thereby does not write the write data to the memory cell array MCA according to the write protect signal WPS (S60).

On the other hand, when the write address WADD does not match the write-protect area address WPADD (NO at S30), the write protect controller WPC inactivates the write-protect selection signal WPSS (S70).

The write mask multiplexer WMMUX transmits the write mask data WM to the serial/parallel converter SPC according to the write-protect selection signal WPSS (S80). The write driver WD thereby writes (or does not write) the write data to the memory cell array MCA according to the write mask data WM (S90).

As described above, the MRAM according to the first embodiment transmits the write protect signal WPS in place of the write mask data WM to the array controller AC when the memory area designated by the preset write-protect area address WPADD is to be accessed. This can forcibly prohibit the data from being written to the memory area designated by the write-protect area address WPADD. Therefore, even if the MRAM according to the first embodiment is used to replace both the nonvolatile ROM and the volatile RAM, it is possible to protect the programs and data within the memory sufficiently robustly by setting the ROM area using the write mask data WM. Needless to mention, in a case where data in the write protect area is necessary to rewrite at the time of firmware update or the like, the write protect switch WPSW is switched to an OFF state and the write-protect selection signal WPSS is made into an always inactive state.

The write-protect area address WPADD can be received from outside of the memory chip 1 via a DDR interface. In this case, it suffices that a write-protect-area designation pin for receiving the write-protect area address WPADD is further provided in an outer edge of the memory chip 1 of the MRAM according to the first embodiment.

The write-protect area address WPADD set in the write protect switch WPSW is often temporarily stored in a register provided in the write protect controller WPC. In such a case, the write-protect area address WPADD held in the register provided in the write protect controller WPC is reset when the setting of the write-protect area address WPADD in the write protect switch WPSW changes.

Second Embodiment

FIG. 6 is a block diagram showing a configuration of an MRAM according to a second embodiment. In the second embodiment, a storage unit that stores therein the write-protect area address WPADD is constituted by the write-protect area address register WPAR. The write-protect area address register WPAR is constituted by a nonvolatile memory and stores therein the address of each write-protect memory bank BANK.

Other constituent elements of the MRAM shown in FIG. 6 can be identical to those of the MRAM shown in FIG. 4. Furthermore, operations of the MRAM shown in FIG. 6 can identical to those of the MRAM shown in FIG. 4. However, the write protect controller WPC obtains the write-protect area address WPADD from the write-protect area address register WPAR.

The write-protect area address register WPAR is the storage unit that stores therein the write-protect area address WPADD. The write-protect area address register WPAR can store therein the write-protect area address WPADD in a non-rewritable state like a fuse or can store therein the write-protect area address WPADD in a rewritable state. It is thereby possible to change (increase or decrease) write protect areas in a memory. In this case, an unnecessary write-protect area address (or unnecessary write-protect area addresses) is deleted from the write-protect area address register WPAR and a corresponding memory area (or memory areas) can be changed to a writable area. Conversely, an address of a writable memory area (or addresses of writable memory areas) can be registered as the write-protect area address (or addresses) WPADD in the write-protect area address register WPAR. It is thereby possible to change the rewritable memory area to the write protect area.

In addition, the second embodiment can achieve effects identical to those of the first embodiment.

The write-protect area address WPADD set in the write-protect area address register WPAR is often temporarily stored in the register provided in the write protect controller WPC. In such a case, the write-protect area address WPADD held in the register provided in the write protect controller WPC is reset when the setting of the write-protect area address WPADD in the write-protect area address register WPAR changes.

Modification of First and Second Embodiments

In FIGS. 4 and 6, the write-protect area address WPADD is set for every memory bank BANK. Alternatively, the write-protect area address WPADD can be set for every page, every memory cell array MCA or every memory chip. The memory bank BANK is a memory management unit. The word lines WL and the bit lines BL are individually provided in the respective memory banks BANK so as to be able to parallel access a plurality of memory banks BANK. The page is a write data unit or a read data unit accessible for every column. Data on one page corresponds to data stored in a plurality of memory cells MC selected by the row address. In this way, memory units of the write-protect area address WPADD can be flexibly changed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A control method for a semiconductor storage device comprising a memory cell array including a plurality of memory cells storing data, the method comprising:
   inputting write mask data and write data;
   selectively outputting a write protect signal when an address of a write protect area in the memory cell array matches an address of the write data, the write protect signal being fixed to first write mask data prohibiting the write data from being written, and the first write mask data being included in the write mask data; and
   selectively outputting the write mask data when the address of the write protect area does not match the address of the write data.

2. The method of claim 1, wherein the address of the write protect area is set for a page, for a memory cell array or for a memory chip, the page being a write data unit, or a read data unit.

3. The method of claim 1, wherein the semiconductor storage device is a nonvolatile memory including a DDR interface.

4. A control method for a semiconductor storage device including a memory cell array including a plurality of memory cells storing data, the method comprising:
   inputting write data; and
   outputting a write protect signal when an address of a write protect area in the memory cell array matches an address of the write data, the write protect signal being fixed to first write mask data prohibiting the write data from being written.

5. The method of claim 4, wherein the address of the write protect area is set for a page, for a memory cell array or for a memory chip, the page being a write data unit, or a read data unit.

6. The method of claim 4, wherein the semiconductor storage device is a nonvolatile memory including a DDR interface.

* * * * *